US006091468A

United States Patent [19]

Kim et al.

[11] Patent Number: 6,091,468

[45] Date of Patent: Jul. 18, 2000

[54] MULTI LIQUID CRYSTAL DISPLAY DEVICE

[75] Inventors: Si-han Kim, Seoul; Byong-sang Song, Suwon, both of Rep. of Korea

[73] Assignee: Samsung Display Devices Co., Ltd., Kyungki-do, Rep. of Korea

[21] Appl. No.: 08/934,764

[22] Filed: Sep. 22, 1997

[30] Foreign Application Priority Data

Sep. 20, 1996 [KR] Rep. of Korea ...................... 96-41375

[51] Int. Cl.[7] ........................... G03F 1/133; G02F 1/1333

[52] U.S. Cl. ................................ 349/73; 349/74; 349/122

[58] Field of Search .............................. 349/122, 84, 157, 349/73, 74

[56] References Cited

U.S. PATENT DOCUMENTS 4,408,836 10/1983 Kikuno ...................................... 349/73
5,056,893 10/1991 Holz et al. ................................ 349/73
5,164,853 11/1992 Shimazaki ................................ 349/73
5,808,719 9/1998 Fujiwara et al. .......................... 349/73

*Primary Examiner*—William L. Sikes
*Assistant Examiner*—Dung Nguyen
*Attorney, Agent, or Firm*—Lowe Hauptman Gopstein Gilman & Berner

[57] ABSTRACT

In a multi liquid crystal display device, the side surfaces of liquid crystal display panels are combined with each other, and each of the liquid crystal display panels includes a pair of substrates facing each other and having liquid crystal injected therebetween. An attachment film is attached to the side surface of the liquid crystal display panel and combined to the adjacent liquid crystal display panel. Each of the liquid crystal display panels are combined by attaching the attachment films to each other.

7 Claims, 3 Drawing Sheets

MULTI LIQUID CRYSTAL DISPLAY DEVICE

BACKGROUND OF THE INVENTION

The present invention relates to a multi liquid crystal display (LCD) device formed by attaching a plurality of liquid crystal display panels, and more particularly, to a multi LCD device in which a discontinuous portion of an image at a junction between LCD panels can be removed.

Recently, LCD have been widely used as low-power-consuming display devices, and screens thereof are expanding in size to display a greater amount of information. The typical size of an LCD is at about 10 inches diagonally and the manufacture of a larger LCD than this is difficult due to limitations of yield and manufacturing equipment, further increasing manufacturing costs.

One manufacturing method of such large LCD'S is is to combine several small LCD panels into a single body. However, the junctions between adjacent LCD panels cannot be avoided, and the junctions form a non-image area displaying a vertical or horizontal line on the entire large screen. Thus, to minimize such a junction is an important factor in the manufacture of a multi LCD.

When LCD panels are combined, the junction between the panels is required to be minimized so that the thickness of the coating of a sealant is equal to or less than 30 $\mu$m. However, in this case, the attachment is weak so that reliability of the LCD is not secured.

Another suggestion by Fujitsu of Japan has been made to solve the above problem by applying an optical configuration, and a multi LCD adopting the same is shown in FIG. 1.

Referring to FIG. 1, two LCD panels 10 and 10' are combined, and each LCD panel has a structure in which liquid crystal 12 is sealed by a sealing member 13 between a pair of transparent substrates 11 facing each other. Optical lenses 14 and 14' are provided to the front of the LCD panels 10 and 10', respectively, and a screen 15 for finally forming an image is provided in front of the optical lenses 14 and 14'. Also, back lights 16 and 16' for emitting light are installed at the rear of the LCD panels 10 and 10'.

In the multi LCD having such a structure, an image is formed by a combination of each of the LCD panels 10 and 10'. At this time, the image is displayed as being divided by a junction 20 between the LCD panels 10 and 10'.

According to this conventional technology, the discontinued portion of the image caused by the junction 20 between the LCD panels 10 and 10' is compensated for by the optical lenses 14 and 14'. That is, the images formed by the respective LCD panels 10 and 10' are magnified by the optical lenses 14 and 14' in a predetermined ratio and then projected to the screen 15. Here, the images which are formed in the LCD panels 10 and 10' and projected to the screen 15 after being magnified by the optical lenses 14 and 14' are fittingly aligned at an image boundary 20a on the screen 15. Thus, the discontinuity of the image caused by the junction 20 can be removed.

However, the above multi-LCD must be provided with back lights 16 and 16' for emitting a light of great intensity and an additional screen 15, making the structure complicated and increasing manufacturing costs.

SUMMARY OF THE INVENTION

To overcome the above problems, it is an objective of the present invention to provide a multi LCD device in which image discontinuity can be removed by improving the structure of the junction between LCD panels, without adopting any additional image compensating means.

Accordingly, to achieve the above first objective, there is provided a multi liquid crystal display device comprising: a plurality of liquid crystal display panels in which the side surfaces thereof are combined with each other, each of the liquid crystal display panels including a pair of substrates facing each other and having liquid crystal injected therebetween; and an attachment film attached to the side surface of the liquid crystal display panel which is combined to the adjacent liquid crystal display panel, in which each of the liquid crystal display panels is combined by attaching the attachment films to each other.

It is preferable in the present invention that the attachment film is attached to the one side of a pixel which is sectioned by a black matrix on the liquid crystal display panel; that the color of the attachment film is the same as that of the black matrix; and that the total thickness of the attachment film interposed between the mutually combined liquid crystal display panels is the same as the width of the black matrix.

BRIEF DESCRIPTION OF THE DRAWINGS

The above objective and advantages of the present invention will become more apparent by describing in detail a preferred embodiment thereof with reference to the attached drawings in which.

DETAILED DESCRIPTION OF THE INVENTION

Figure 2:
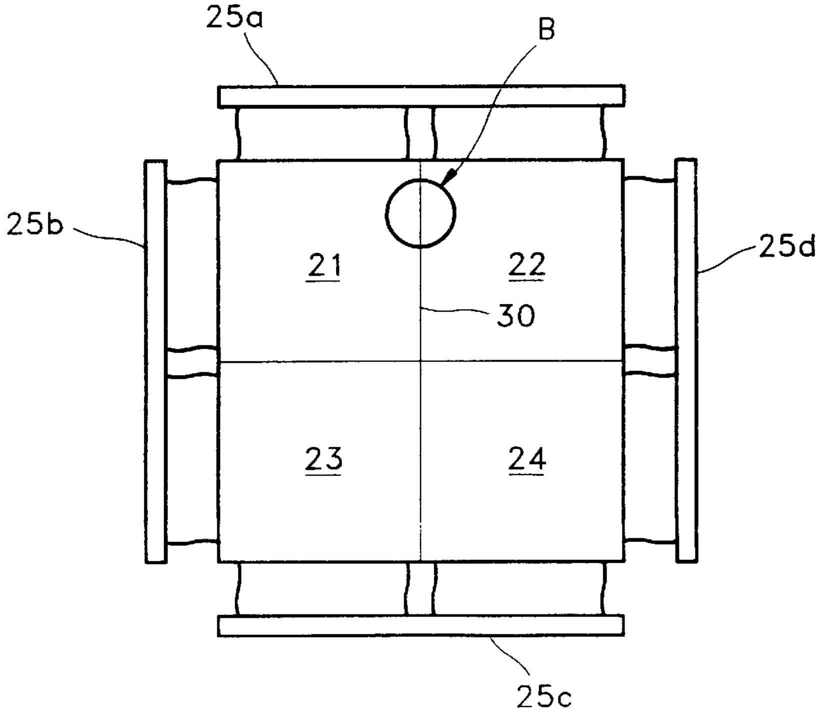
FIG. 2 is a plan view illustrating a multi LCD device according to the present invention.

As shown in FIG. 2, a multi LCD device according to a preferred embodiment of the present invention is formed by combining four LCD panels 21, 22, 23, 24. Here, the number of LCD panels should not be limited to the present embodiment.

The LCD panels 21, 22, 23 and 24 are electrically connected to driving circuits 25*a* and 25*b*, 25*a* and 25*d*, 25*b* and 25*c*, and 25*c* and 25*d*, respectively, and each driving circuit applies an appropriate voltage according to an image signal.

Figure 3:
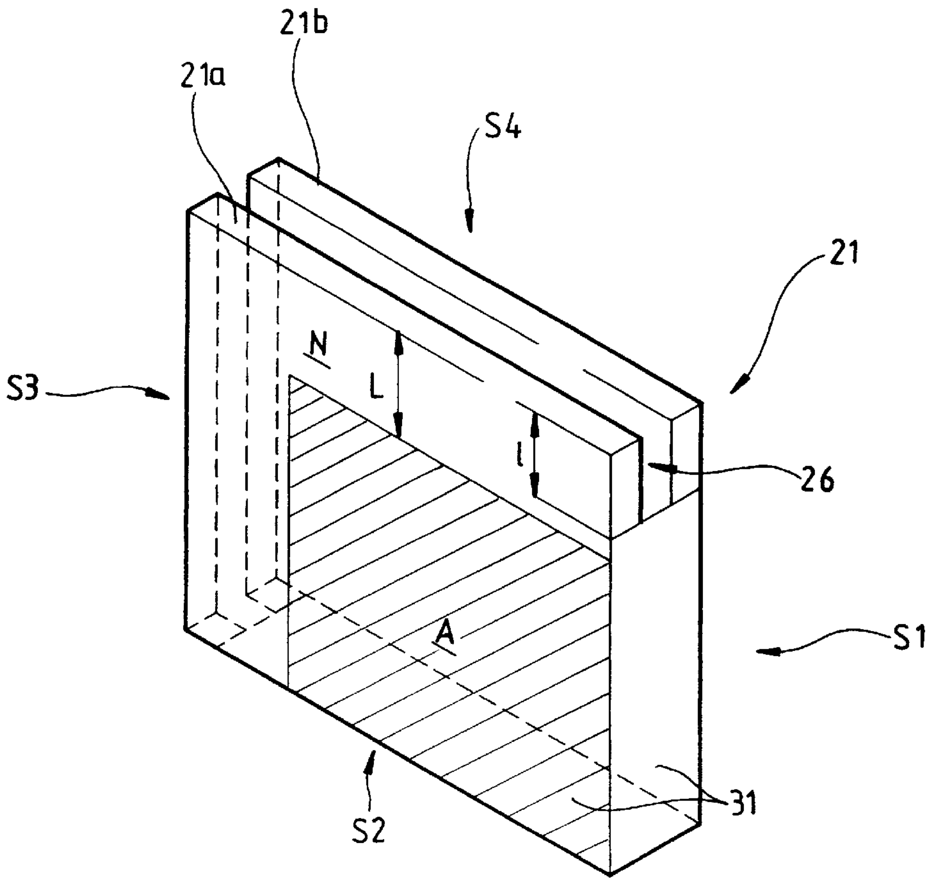
FIG. 3 is a perspective view illustrating the structure of an LCD panel of the LCD shown in FIG. 2.

The structure of the LCD panel 21 is shown in detail in FIG. 3. Referring to the drawing, the LCD panel 21 includes a pair of substrates 21*a* and 21*b* facing each other with liquid crystal injected therebetween sectioned into an active area "A" in which pixels form an image and a non-active area "N" in which an image is not formed.

Figure 1:
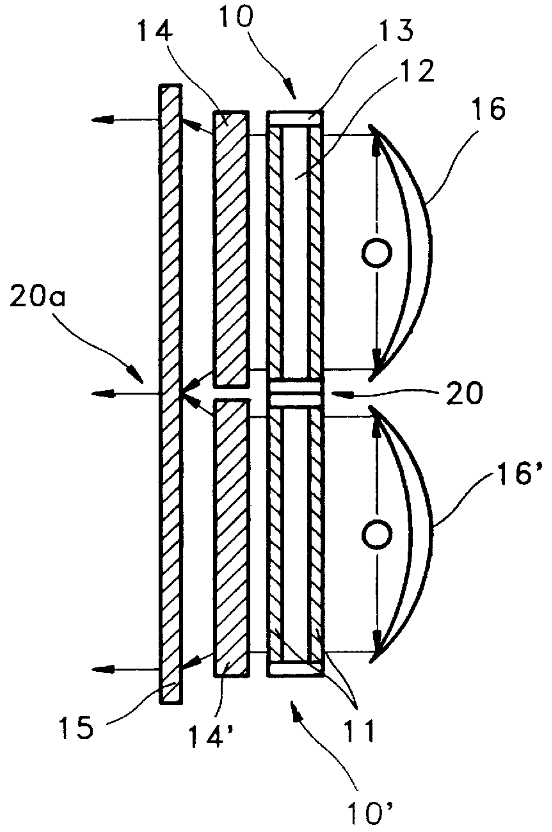
FIG. 1(PRIOR ART)
FIG. 1 is a sectional view illustrating a conventional multi LCD.

An attachment film 31, instead of a sealing member (13 of FIG. 1), is attached to the side surfaces S1 and S2 of the LCD panel 21 in with contact the other LCD panels 22 and 23 (see FIG. 2). Also, the other side surfaces S3 and S4 of the LCD panel 21, which do not contact the other LCD panels, are sealed using a sealing member and a sealant as described earlier. The attachment film 31 is preferably a common resin film, and a thin glass or an insulated metal piece can be used therefor.

Also, it is preferable that the side surface Si of the LCD panel 21 is not completely sealed by the attachment film 31 to form an inlet 26 for the injection of liquid crystal. Here, the attachment film 31 is attached longer than at least active area "A" which forms an image on the LCD panel. That is, it is preferable that the length "1" of the side surface S1 of the LCD panel 21 which is not to be sealed by the attachment film 31 is less than the width "L" of the non-active area "N". This is to prevent an ill effect of an ultraviolet-curing resin, which is usually used to seal the inlet 26 after liquid crystal is injected therethrough, by penetrating active area "A" of the LCD panel 21.

Figure 4:
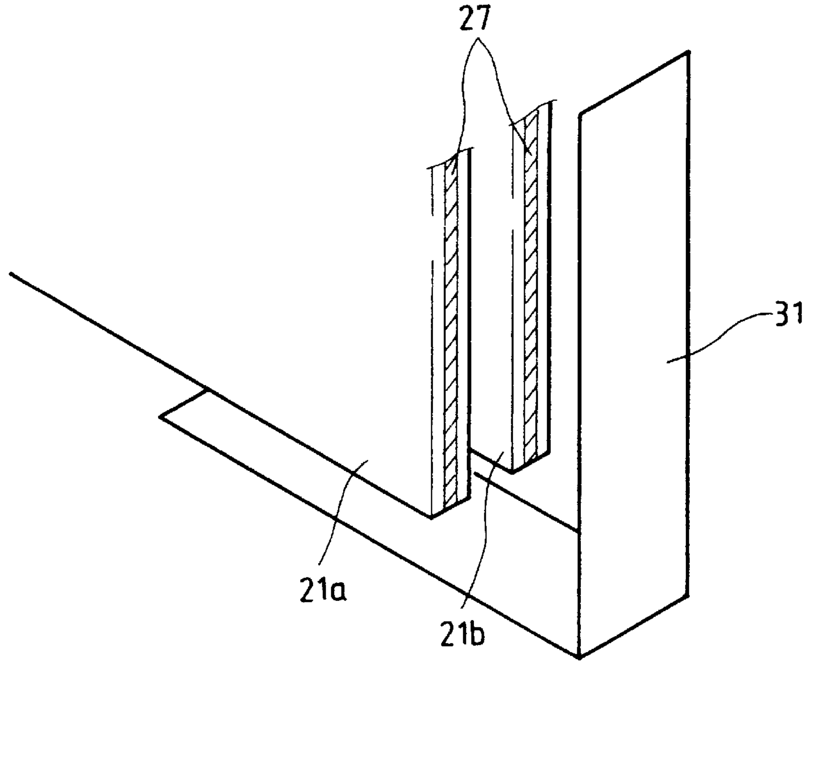
FIG. 4 is a view showing a state in which a contact film is attached to the side surface of the LCD panel shown in FIG. 3.

FIG. 4 shows a state in which the attachment film 31 is attached to the side surfaces Si and S2 of the LCD panel 21. As shown in the drawing, an adhesive 27 is coated on the side surfaces of the respective substrates 21*a* and 21*b*. Here, it is preferable that the adhesive 27 is coated by a roller (not shown), or by an injector (not shown) in strips, to have a width less than the thickness of each of the substrates 21*a* and 21*b*. Accordingly, when the attachment film 31 is pressed to be attached, the coated adhesive 27 is spread and the adhesion is completed. Here, a usual sealant is used as the adhesive to attach the attachment film 31 to the substrates 21*a* and 21*b*, and the thickness of the attachment layer is preferably below 10 μm. Also, it is preferable that the thickness of the attachment films 31 and 32 (see FIG. 5) are between 15–25 μm.

Although the attachment film 31 can be separately attached to each of the side surfaces S1 and S2, it is preferable that a single strip of the attachment film 31 is used for the attachment, as shown in FIG. 4.

Figure 5:
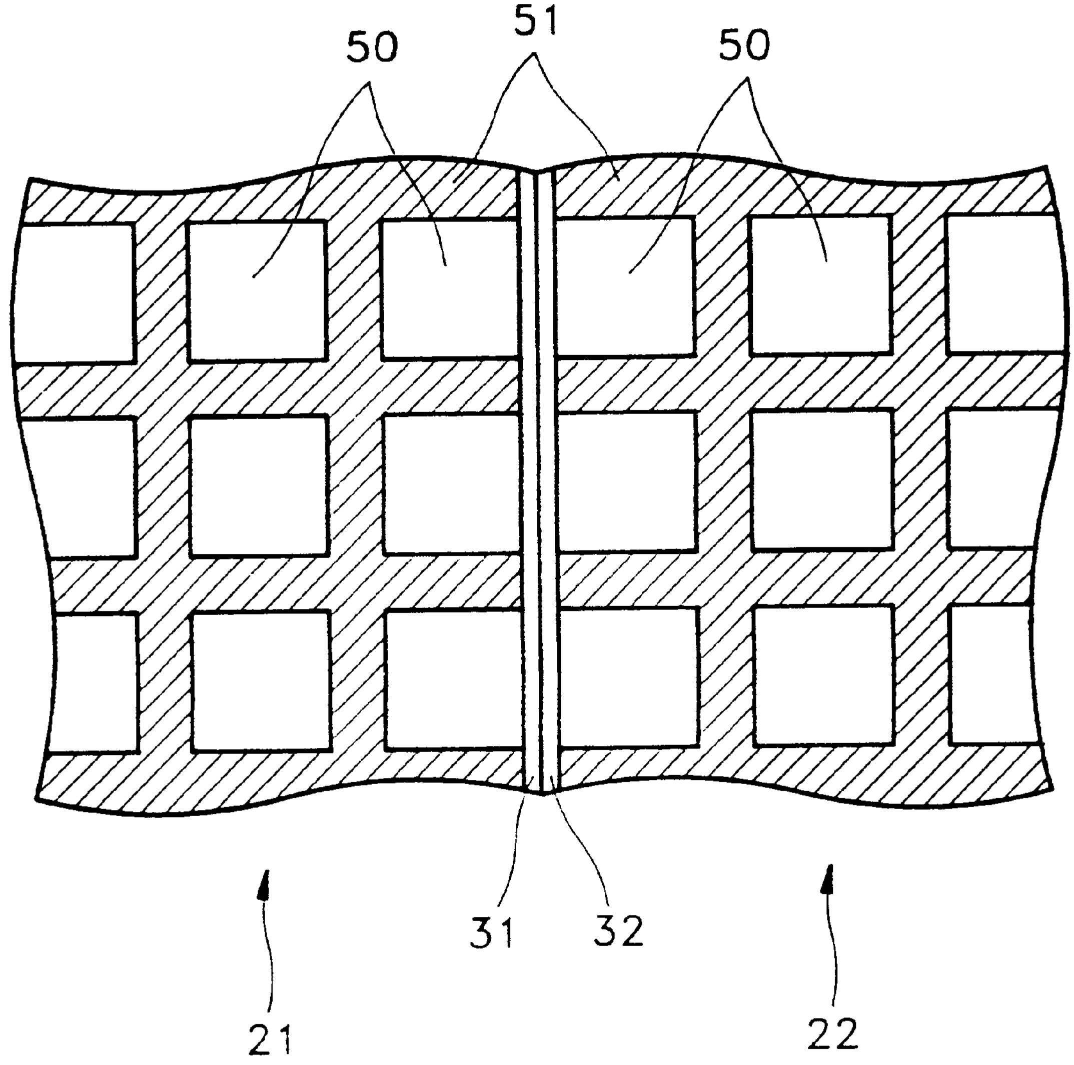
FIG. 5 is a magnified view of portion "B" of FIG. 2.

FIG. 5 shows the junction 30 of FIG. 2 by magnifying the same. In the drawing, the attachment films 31 and 32 are respectively attached to the side surfaces of the LCD panels 21 and 22 in which a pixel 50 is sectioned by a black matrix 51. The attachment films 31 and 32 are directly attached to one side surface of the pixel 50 to thereby minimize the thickness of the junction.

The LCD panels 21 and 22 are mutually combined as the attachment films 31 and 32 respectively attached to the LCD panels 21 and 22 are attached to each other. The color of the attachment films 31 and 32 is black like the black matrix 51. Also, it is preferable that the total thickness of the attachment films 31 and 32 attached together is equal to or similar to the thickness of the black matrix 51 on the LCD panels 21 and 22. Further, since the attachment films 31 and 32 are black, a viewer cannot easily notice the attachment films 31 and 32 and the junction 30. Thus, the discontinuity of the image caused by lines crossing over the screen as mentioned earlier can be removed.

In the preferred embodiment of the present invention, although a plurality of LCD panels are combined by mutually attaching the attachment films, a multi LCD panel can be formed by arranging the plurality of LCD panels such that the attachment films mutually contact and support the outer edges of the closely arranged LCD panels using a frame.

As described above, according to the present invention, since the LCD panels are combined by the attachment films having the same thickness and color as the black matrix, the discontinuity of an image due to the junction can be removed.

Also, since the LCD panels are simply attached by an adhesive, a large multi LCD device can be easily manufactured with lower costs.

What is claimed is:

1. A liquid crystal display device comprises a plurality of liquid crystal display panels; each having a front plate and a rear plate spaced apart from each other and a liquid crystal disposed between said front and rear plates, wherein the front and rear plates of each panel are sealed with strip-shaped films on at least one side of the panel; such said side of one of the panels is attached to side of another one of the panels with respective strip-shaped film therebetween; and a plurality of pixels formed on one of said plates are separated by a black matrix, wherein at least one row of pixels is located at an edge of said one of said plates; such that a side of said at least one row of pixels coincides with the edge of the plate to which said films are respectively attached.

2. The liquid crystal display device according to claim 1, further comprising adhesive coating on sides of the front and rear plates, where said strip-shaped films are positioned with said coating to securely couple said strip-shaped films to the plates.

3. The liquid crystal display device according to claim 1, the width of said strip-shaped films is less than half of that of the black matrix.

4. A liquid crystal display device comprises multi-liquid crystal display panels; each having front and rear plates spaced apart from each other with a liquid crystal therebetween; each panel including a plurality of pixels surrounded on at least three sides thereof with a black matrix; and wherein edges of adjacent said panels adapted to form a junction with each other include a strip-shaped film attached directly to the associated edge of said panel forming said junction without black matrix disposed therebetween.

5. The device of claim 4, wherein the attachment film is a strip-shaped film having a color the same as the color of the black matrix.

6. The device of claim 5, wherein a total thickness of said attachment films forming said junction is about equal to or less than the thickness of the black matrix formed between adjacent pixels of a respective panel.

7. The device of claim 5, wherein said strip-shaped films are preformed strips.

* * * * *